United States Patent [19]

Tanaka et al.

[11] Patent Number: 5,100,758

[45] Date of Patent: Mar. 31, 1992

[54] POSITIVE-WORKING PHOTORESIST COMPOSITION CONTAINING QUINONE DIAZIDE COMPOUND, NOVOLAK RESIN AND ALKYL PYRUVATE SOLVENT

[75] Inventors: Hatsuyuki Tanaka; Hidekatsu Kohara, both of Chigasaki; Toshimasa Nakayama, Hiratsuka, all of Japan

[73] Assignee: Tokyo Ohka Kobyo Co., Ltd., Kanagawa, Japan

[21] Appl. No.: 623,014

[22] Filed: Dec. 6, 1990

[30] Foreign Application Priority Data

Jun. 1, 1990 [JP] Japan ............... 2-141649

[51] Int. Cl.$^5$ ............... G03F 7/023; G03C 1/61
[52] U.S. Cl. ............... 430/191; 430/192; 430/193; 430/165
[58] Field of Search ............... 430/191, 192, 193

[56] References Cited

U.S. PATENT DOCUMENTS 4,373,017  2/1983  Masukawa et al. ............... 430/191
4,707,430  11/1987  Ozawa et al. ............... 430/191
4,939,056  7/1990  Hotomi et al. ............... 430/66
4,983,492  1/1991  Trefonas, III et al. ............... 430/191

OTHER PUBLICATIONS

"Hackh's Chemical Dictionary", fourth edition, 1969, pp. 253 and 426.

*Primary Examiner*—Charles L. Bowers, Jr.
*Assistant Examiner*—Christopher G. Young
*Attorney, Agent, or Firm*—Wyatt, Gerber, Burke and Badie

[57] ABSTRACT

A proposal is made for the use of an alkyl pyruvate or a solvent mixture mainly composed thereof as a solvent in a positive-working photoresist composition comprising an alkali-soluble novolac resin as the film-forming ingredient and a quinone diazide group-containing compound as the photosensitive ingredient. By virtue of the use of the unique solvent, the photoresist composition is advantageous in the outstandingly high stability with little moisture absorption from ambience not to cause precipitation of solid matters in addition to the quite satisfactory properties in other respects as a photoresist composition.

6 Claims, No Drawings

POSITIVE-WORKING PHOTORESIST COMPOSITION CONTAINING QUINONE DIAZIDE COMPOUND, NOVOLAK RESIN AND ALKYL PYRUVATE SOLVENT

BACKGROUND OF THE INVENTION

The present invention relates to a positive-working photoresist composition or, more particularly, to a positive-working photoresist composition which can be used in the manufacture of finely patterned semiconductor devices such as integrated circuits by a photolithographic process advantageously in respect of the excellent storage stability and highly orthogonal cross sectional profile of the resist patterns formed therewith as well as absence of drawbacks due to precipitation of the photosensitive ingredient contained therein.

As is well known, the progress of the semiconductor technology in recent years is so remarkable, in particular, in the more and more increasing degree of integration in semiconductor-based integrated circuits already running in the era of megabits integration. The photolithographic process is a key process for patterning on semiconductor substrates by virtue of the applicability thereof to any large-scale mass production throughout the history of development of integrated circuits beginning with the dawning stage where the integrated circuits were of the planar type of only a very low degree of integration to the up-to-date stage where the major current of the technology is for VLSIs of megabits integration.

The above mentioned photolithographic process is performed, in principle, by coating the surface of a substrate such as semiconductor silicon wafer with a solution-type photoresist composition followed by drying to provide a uniform photoresist layer cn the substrate surface and then pattern-wise exposure of the photoresist layer to light through a photomask bearing a desired circuit pattern to form a latent image followed by development of the latent image to form a patterned photoresist layer on the substrate surface which serves as a mask in the subsequent etching or other processing treatments.

Photoresist compositions used as a masking material against etching can be classified according to the types of the photosensitivity into so-called negative-working and positive-working ones. Namely. the photoresist composition of the former type is insolubilized in a developer solution by exposure to light as a result of a photochemical crosslinking reaction of the polymeric ingredient therein while the photoresist composition of the latter type is imparted with increased solubility in a developer solution by exposure to light. Integrated circuits at the early stage of development were manufactured mostly by using a negative-working photoresist composition of which the photoresist layer was pattern-wise exposed to light through a photomask in direct contact with the photoresist layer. Negative-working photoresist compositions in general have some disadvantages that the resolving power of patterning therewith has a limitation due to swelling of the patterned resist layer in the developer solution in addition to the problem that the photomask used in contacting exposure on the photoresist layer is unavoidably subject to mechanical damages more or less. Accordingly, it is a trend in recent years when the degree of integration in VLSIs is 256 kilobits or larger with a patterning fineness of 1.3 to 1.2 $\mu$m or even finer that a positive-working photoresist composition capable of giving a higher resolving power is used in combination with the patterning method by manifying projection exposure to light by more and more replacing the negative-working photoresist compositions. As to the etching treatment with the patterned resist layer as the mask, the wet etching process using an etching solution can no longer be used when the patterning fineness is in the submicron range due to the isotropic nature of the etching therewith. Instead, the etching treatment is performed by the dry etching method using an etchant gas in which etching proceeds anisotropically in the direction perpendicular to the substrate surface resulting in high fidelity to the pattern of the resist layer.

It is a notable fact that the fidelity or orthogonality of the dry etching treatment with a patterned resist layer as a mask is under a profound influence of the cross-sectional profile configuration of the patterned resist layer. In the patterning of the photoresist layer by pattern-wise exposure to light, furthermore, the contrast between the exposed areas and unexposed areas should desirably be as high as possible while the contrast in the manifying projection exposure is disadvantageously low especially when the patterning fineness is in the submicron order. When the exposure dose given on to a positive-working photoresist layer is increased to such an extent that the layer in the exposed areas is imparted with full solubility in a developer solution, the unavoidable exposure dose on the "unexposed" areas or areas not to be exposed must be correspondingly increased to undesirably enhance the solubility of the resist layer in the unexposed areas so that disadvantages are caused in respect of a decrease in the orthogonality of the cross-sectional profile of the patterned resist layer and in the fidelity or dimensional accuracy of the pattern reproduction. This phenomenon is particularly disadvantageous in dry etching because not only the substrate surface but also the patterned resist layer are subject to etching more or less so that the cross-sectional profile of the patterned resist layer may affect the orthogonality of the etching treatment.

The above mentioned problems could be solved, as a principle, by improving the resolving power of patterning with a decreased exposure dose so as to improve the orthogonality of the cross-sectional profile configuration of the patterned photoresist layer.

Conventional positive-working photoresist compositions are mostly of the type of a mixture comprising a photosensitive compound containing a quinone diazide group and a novolac resin as a film-forming constituent while it is known, as is taught by U.S. Pat. No. 3,148,983, a problem in a composition of this type is the poor miscibility of the quinone diazide group-containing compound with organic solvents sometimes to cause precipitation of the photosensitive compound in the photoresist composition.

As is understood from the above given description, the history of development of positive-working photoresist compositions thus far made has proceeded along the guide line to enhance the sensitivity including improvements of the miscibility of the components in the photoresist composition to prevent occurrence of precipitation therein. In this regard, it is noteworthy that the positive-working photoresist compositions conventionally available on the market are formulated mostly with a photosensitive compound which is a modification of the polyhydroxy benzophenone derivative disclosed in the above mentioned United States patent.

On the other hand, of course, efforts have been made to obtain a high contrast of the photoresist in the technology of photolithography by the minifying projection exposure for patterning relative to the manufacture of VLSIs of 256 kilobits or larger density with a fineness of 1.2 to 1.3 μm or finer. The investigations therefor have been directed mainly to the improvement of the novolac resin as the film-forming constituent. In this regard, a number of reports have been published disclosing the results of the studies on the blending proportion of a cresol novolac resin [see Japanese Patent Kokai No. 62-35349 and No. 62-270951], relative positions of the methylene linkages bonding the cresol units [see Proc. of SPIF 631. Advances in Resist Technology and Processing. 1986, pages 76–82], combination of m-cresol, p-cresol and xylenol as the phenolic constituent of the novolac resin [see Proc. of SPIF 920. Advances in Resist Technology and Processing, 1988, pages 134–141] and so on.

In the above mentioned quinone diazide group-containing compound which is usually an esterification product of a polyhydroxy benzophenone and a naphthoquinone-1,2-diazide sulfonyl chloride, on the other hand, it is known that increase in the degree of the esterification reaction has an effect to improve the orthogonality of the patterned photoresist layer [see Proc. of SPIF 732. Advances in Resist Technology and Processing, 1987, pages 194–210. Japanese Patent Kokai No. 1-179147 and 1st Micro Process Conference, 1988, July, 4-6, Tokyo, pages 160–161]. The proposal for an increase in the degree of esterification, however, is not without another difficult problem because the solubility of the guinone diazide group-containing compound, which is inherently poor in the miscibility with the other ingredients in the photoresist composition, in organic solvents is further decreased by increasing the degree of esterification thereof. In this respect, various proposals and attempts have been made to select different organic solvents in which the quinone diazide group-containing compounds have good solubility even when the degree of esterification thereof is high.

Various organic solvents have been hitherto proposed as a solvent in a positive-working photoresist composition although each of them has its own advantages and disadvantages. For example, ethylene glycol monoethyl ether acetate is not good enough as a solvent for the photosensitive compound. Cyclopentanone proposed in Japanese Patent Kokai No. 59-155838 practically cannot be used as the solvent due to the eventual decomposition of the quinone diazide group-containing photosensitive compound therein resulting in a decrease in the photosensitivity of the composition though with somewhat improved solubility behavior in its part. The alkyl monohydroxycarboxylatess proposed in Japanese Patent Kokai No. 62-123444 generally have high hygroscopicity to cause eventual precipitation of the photosensitive compound when the solvent contains water by absorption so that the storage stability of the composition is greatly decreased unless in a hermetically sealed condition. Combinations of a cyclic ketone and an alcohol proposed in U.S. Pat. No. 4,526,856 also have similar disadvantages. Propylene glycol monoalkyl ether acetates proposed in Japanese Patent Kokai No. 61-7837 are impractical due to the poor miscibility thereof with the photosensitive compound.

A photoresist composition prepared by using the above named conventional organic solvents has further problems including the poor step-coverage characteristics when the composition is applied to the substrate surface having a level difference between areas making a step and eventual appearance of necking in the cross-sectional profile of the patterned resist layer formed from the composition using the solvent at the interface between the resist layer and the substrate surface not to give a satisfactory patterned resist layer.

To summarize, all of the positive-working photoresist compositions using a conventional organic solvent are defective in respect of the storage stability of the composition and the step-coverage characteristics in application to a substrate surface having a level difference. In particular, no satisfactory solvent is known for a photoresist composition containing a photosensitive compound which is an esterification product of a polyhydroxy benzophenone and naphthoquinone-1,2-diazide sulfonic acid, especially, when the degree of esterification is high, in respect of the relatively low solubility of the photosensitive compound in the solvent or the water-absorptivity of the solvent.

SUMMARY OF THE INVENTION

In view of the above described problems and disadvantages in the positive-working photoresist compositions of the prior art, the present invention has an object to provide a novel and improved positive-working photoresist composition in the form of a solution which is free from the problems in respect of the solubility of the photosensitive compound in the solvent and absorption of water in the solvent affecting the storage stability of the composition and capable of giving a patterned resist layer having a highly orthogonal cross-sectional profile on the substrate surface.

Thus, the positive-working photoresist composition of the present invention is a uniform solution which comprises:

(a) an alkyl pyruvate or a mixture of organic solvents mainly composed of an alkyl pyruvate as the solvent;

(b) an alkali-soluble resin dissolved in the solvent; and (c) a compound containing a quinone diazide group dissolved in the solvent.

DETAILED DESCRIPTION OF THE PREFERRED EMBODIMENTS

As is understood from the above given description, the most characteristic feature of the inventive photoresist composition consists in the use of an alkyl pyruvate as the solvent, i.e. component (a), while the other essential components (b) and (c) are rather conventional. An alkyl pyruvate is a compound represented by the general formula $CH_3-CO-CO-OR$, in which R is an alkyl group. As a kind of esters of a monobasic keto-acid, alkyl pyruvates have unique properties something like a combination of an ester and a ketone.

The alkali-soluble resin as the component (b) in the inventive composition is exemplified by novolac resins, acrylic resins, copolymers of styrene and acrylic acid, polymers of hydroxystyrene, polyvinyl phenols, poly-(α-methyl vinyl phenols) and the like, of which alkali-soluble novolac resins are preferred. Various kinds of alkali-soluble novolac resins can be used without particular limitations and any of conventional alkali-soluble novolac resins used as a film-forming resin in positive-working photoresist compositions can be used including, for example, those prepared by the condensation reaction of a phenolic compound such as phenol, cresol, xylenol and the like with an aldehyde compound such as formaldehyde in the presence of an acidic catalyst. The alkali-soluble novolac resin desirably is freed from the low molecular weight fraction by fractionation and has a weight-average molecular weight in the range from 2,000 to 20,000 or, preferably, from 5,000 to 15,000.

The component (c) in the inventive composition is a photosensitizing ingredient which is preferably a compound having a quinone diazide group in the molecule. The quinone diazide group-containing compound suitable for use is exemplified by partial or full esterification products of a quinone diazide sulfonic acid, e.g., 1,2-benzoquinone diazide, 1,4-benzoquinone diazide, 1,2-naphthoquinone diazide, 1,2-anthraquinone diazide and the like, and a phenolic compound and partial or full amidation products of a quinone diazide sulfonic acid and an amino compound.

The above mentioned phenolic compound includes, for example, polyhydroxy benzophenones such as 2,3,4-trihydroxy benzophenone, 2,2',4,4'-tetrahydroxy benzophenone, 2,3,4,4'-tetrahydroxy benzophenone and the like, alkyl gallates, aryl gallates, phenol, phenolic resins, p-methoxy phenol, dimethyl phenols, hydroquinone, polyhydroxy diphenyl alkanes, polyhydroxy diphenyl alkenes, bisphenol A, $\alpha,\alpha',\alpha''$-tris(4-hydroxyphenyl)-1,3,5-triisopropyl benzene, 1-[1-(4-hydroxyphenyl)isopropyl]-4-[1,1-bis(4-hydroxyphenyl)ethyl] benzene, tris(hydroxyphenyl)methane and methyl-substituted compounds thereof, naphthols, pyrocatechol, pyrogallol, pyrogallol monomethyl ether, pyrogallol 1,3-dimethyl ether, gallic acid, partially esterified or etherified gallic acid and the like. The amino compound mentioned above includes, for example, aniline, p-amino diphenyl amine and the like.

Examples of particularly preferable quinone diazide group-containing compounds include partial and full esterification products of a polyhydroxy benzophenone and naphthoquinone-1,2-diazide-5-sulfonic acid or naphthoquinone-1,2-diazide-4-sulfonic acid, of which the average degree of esterification is at least 70%. These quinone diazide group-containing compounds can be prepared by effecting a condensation reaction to give a desired degree of esterification between a polyhydroxy benzophenone and naphthoquinone-1,2-diazide-5-sulfonyl chloride or naphthoquinone-1,2-diazide-4-sulfonyl chloride in a suitable solvent such as dioxane in the presence of an alkaline compound such as triethanolamine, alkali carbonates, alkali hydrogencarbonates and the like as an acid acceptor.

It is of course optional according to need that the component (c) is a combination of two kinds or more of the above named quinone diazide group-containing compounds.

The positive-working photoresist composition of the invention is prepared by dissolving the above described alkali-soluble resin as the component (b) and the quinone diazide group-containing compound as the component (c) in an alkyl pyruvate as the component (a) to serve as a solvent. The alkyl group forming the alkyl pyruvate is exemplified by, for example, methyl, ethyl, propyl, isopropyl, butyl, isobutyl, sec-butyl and tert-butyl groups. Any of the alkyl pyruvates with these alkyl groups can be used without particular limitations but methyl and ethyl pyruvates are preferred. It is preferable that the solvent as the component (a) for the components (b) and (c) is an alkyl pyruvate or a mixture of alkyl pyruvates alone without admixture of a solvent of other types, in particular, when the quinone diazide group-containing compound is an esterified compound and the average degree of esterification therein is high.

It is, however, optional, that the solvent as the component (a) used for dissolving the components (b) and (c) is a mixture of an alkyl pyruvate and one kind or more of other organic solvents than alkyl pyruvates. When such a solvent mixture is used, the proportion of the alkyl pyruvate in the solvent mixture should be at least 70% by weight or, preferably, at least 80% by weight.

Examples of the above mentioned organic solvents other than alkyl pyruvates used in combination therewith include aromatic hydrocarbon solvents such as toluene and xylene, esters such as methyl acetate, ethyl acetate, butyl acetate, methyl lactate, ethyl lactate, methyl 3-methoxypropionate, methyl 4-methoxypropionate, methyl 3-ethoxypropionate, methyl 4-methoxypropionate, methyl 3-ethyoxypropionate, ethyl 3-ethoxypropionate and ethyl 4-ethoxybutyrate, polyhydric alcohols and esters and ethers thereof such as ethylene glycol, ethylene glycol monomethyl ether, ethylene glycol monoethyl ether, ethylene glycol monobutyl ether, ethylene glycol monomethyl ether acetate, ethylene glycol monoethyl ether acetate, ethylene glycol monobutyl ether acetate, propylene glycol, propylene glycol monomethyl ether, propylene glycol monoethyl ether and propylene glycol monobutyl ether, ketones such as methyl ethyl ketone, methyl isobutyl ketone, cyclopentanone and cyclohexanone, and so on.

The amount of the quinone diazide group-containing compound as the component (c) in the inventive composition is in the range, usually, from 10 to 40% by weight or, preferably, from 18 to 30% by weight based on the amount of the alkali-soluble resin as the component (b). When the amount of the component (c) is too small, the patterned resist layer formed from the photoresist composition would have a poor cross sectional profile not suitable for practical use as a mask against etching and in other processing treatments. When the amount of the component (c) is too large, on the other hand, the sensitivity of the photoresist composition to light would be unduly decreased.

The amount of the alkyl pyruvate or a solvent mixture as the component (a) relative to the other components is not particularly limitative since this component is a solvent to dissolve the other components, primarily, to facilitate the coating works therewith. Accordingly, the amount thereof should be adequately selected depending on the desired coating workability of the composition and the desired thickness of the photoresist layer after evaporation of the solvent. As a rough measure, the alkyl pyruvate or the solvent mixture as the component (a) can be used in an amount in the range from 50 to 2000 parts by weight or, preferably, from 100 to 1000 parts by weight per 100 parts by weight of the total amount of the components (b) and (c). When the amount of the component (a) is too small, the composition is too thick to have good workability in coating or precipitates may eventually be formed in the composition. When the amount thereof is too large, on the other hand, the concentration of the solid matter in the composition is so low that the thickness of the resist layer formed by coating the substrate surface with the photoresist composition after drying would be too small to serve as a resist.

It is optional that the positive-working photoresist composition of the invention is further admixed with various kinds of other known additives having miscibility with the essential components each in a limited amount. Examples of such optional additives include adjuvant resins, plasticizers and stabilizers to improve the properties of the resist layer, coloring agents to improve the visibility of the patterned resist layer, photosensitizers to enhance the photosensitivity of the composition to light, contrast improvers and so on. These optional additives are used by dissolving in the alkyl pyruvate as the solvent together with the components (b) and (c) to form a uniform solution.

Following is a description of a typical procedure for using the inventive positive-working photoresist composition in the photolithographic process for patterning. Thus, the inventive photoresist composition prepared by dissolving the components (b) and (c) together with other optional additives in an alkyl pyruvate as the component (a) is evenly applied to the surface of a substrate such as semiconductor silicon wafer by using a suitable coating machine such as a spinner followed by drying to form a photosensitive layer which is then exposed pattern-wise to ultraviolet light coming from a suitable light source such as low-pressure, high-pressure and ultrahigh-pressure mercury lamps, arc lamps, xenon lamps and the like either through a photomask bearing a desired pattern in direct contact with the photoresist layer or by minifying projection exposure through a photomask to form a latent image. Alternatively, the photoresist layer can be irradiated pattern-wise with a laser beam from an excimer laser or an X-ray beam through a patterned mask. Thereafter, the photoresist layer having the patterned latent image is developed by immersing in an aqueous alkaline solution, for example, of tetramethyl ammonium hydroxide in a concentration of 1 to 10% by weight so that the photoresist layer having been imparted with increased solubility to the alkaline solution in the areas pattern-wise exposed to light is selectively dissolved away leaving a patterned resist layer in the unexposed areas having fidelity to the pattern on the photomask.

The patterned resist layer formed in the above described manner can be used advantageously as a mask not only in the processing of semiconductor devices but also in any working utilizing the techniques of photolithography such as preparation of LCDs (liquid crystal displays), TABs (tape-automated bondings), PCBs (printed circuit boards), printing plates and the like as well as chemical milling. These advantages are the results of the use of an alkyl pyruvate as the solvent of the composition by virtue of which the composition is freed from the problem of absorption of water in the course of preparation and storage of the composition as well as in the coating works therewith and the composition is imparted with greatly improved storage stability in addition to the improved performance of step-coverage.

In the following, examples are given to illustrate the positive-working photoresist composition of the invention in more detail but not to limit the scope of the invention in any way.

EXAMPLE 1.

A positive-working photoresist composition in the form of a coating solution was prepared by dissolving, in 50 g of methyl pyruvate, 2 g of a reaction product between 1 mole of 2,3,4,4'-tetrahydroxy benzophenone and 3 moles of naphthoquinone 1,2-diazide-5-sulfonyl chloride and 8 g of a cresol novolac resin. The thus prepared coating solution was taken in a glass beaker of 100 ml capacity and kept standing in and exposed to an atmosphere of 60% relative humidity at 25° C. The content of water in the photoresist solution was determined by the automatic Karl-Fischer's titration method either before or after 6 hours or 12 hours of exposure to the above mentioned atmosphere. The results are shown in Table 1. The photoresist composition as prepared was filtered through a membrane filter of 0.2 μm pore diameter and kept standing at 40° C. under a hermetically sealed condition to be visually examined for the appearance of precipitates of solid matter. The result was that the solution of the composition was clear after 3 months of storage. The sensitivity of this photoresist composition was not affected by this storage test for 5 months at 40° C.

A 6-inch silicon wafer was coated with the photoresist composition by using a spinner in a coating thickness of 1.3 μm after drying at 90° C. for 90 seconds on a hot plate to form a photosensitive layer which was exposed to light patternwise by minifying projection exposure on an exposure machine (Model NSR-1505G-4D, manufactured by Nikon Co.) through a photomask bearing a test pattern. The silicon wafer was heated on a hot plate at 110° C. for 90 seconds and then the photoresist layer was developed by immersing for 65 seconds in a 2.38% by weight aqueous solution of tetramethyl ammonium hydroxide at 23° C. followed by washing with running water for 30 seconds and drying to give a patterned resist layer on the substrate surface. The cross-sectional profile of the thus formed patterned resist layer was microscopically examined to find no necking of the patterned layer at the interface with the substrate surface.

Further, another silicon wafer having a surface with a stepwise level difference of 1 μm between areas was coated with the photoresist solution using a spinner in a coating thickness of 1.5 μm on the flat areas after drying in the same manner as above. The coverage of the substrate surface with the photoresist layer was microscopically examined at the stepped portion between the areas having the level difference to find that the step coverage was excellent and quite satisfactory.

EXAMPLES 2 TO 4 AND COMPARATIVE EXAMPLES 1 TO 5.

The experimental procedure in each of these examples and comparative examples was substantially the same as in Example 1 above excepting replacement of the methyl pyruvate as the solvent with the same amount of another solvent or a mixture of different solvents indicated in Table 1, which shows the increase in the water content in the photoresist solutions by exposure to the atmosphere in the same manner as in the water absorption test of Example 1.

No precipitats were found in the photoresist solution in each of these examples and comparative examples after 3 months of the storage test excepting Comparative Examples 1, 3 and 4 although no precipitates were found at all even in these comparative examples after 1 month of storage.

The sensitivity of the photoresist compositions to light was unaffected in these examples and comparative examples excepting Comparative Examples 2 and 5 after 3 months of storage at 40° C.

The cross-sectional profile in each of Examples 2 to 4 was as satisfactory as in Example 1 while the profile in each of Comparative Examples 1 to 5 was poor with appearance of necking at the interface with the substrate surface.

The results of the step coverage test were that the step coverage was excellent in each of Examples 2 to 4, poor but tolerable in each of Comparative Examples 4 and 5 and impractically poor in each of Comparative Examples 1 to 3.

TABLE 1

| | Solvent | | Water content, % by weight | | |
|---|---|---|---|---|---|
| | Kind | % by weight | As prepared | After 6 hours | After 12 hours |
| Example | | | | | |
| 1 | Methyl pyruvate | 100 | 0.08 | 0.12 | 0.18 |
| 2 | Ethyl pyruvate | 100 | 0.08 | 0.12 | 0.19 |
| 3 | Methyl pyruvate | 30 | 0.07 | 0.13 | 0.20 |
| | Ethyl pyruvate | 60 | | | |
| | Xylene | 10 | | | |
| 4 | Ethyl pyruvate | 70 | 0.08 | 0.13 | 0.21 |
| | Xylene | 10 | | | |
| | Methyl lactate | 20 | | | |
| Comparative Example | | | | | |
| 1 | ECA* | 100 | 0.08 | 0.12 | 0.19 |
| 2 | Cyclopentanone | 100 | 0.10 | 0.15 | 0.25 |
| 3 | Ethyl lactate | 100 | 0.10 | 0.20 | 0.30 |
| 4 | Methyl lactate | 20 | 0.09 | 0.14 | 0.23 |
| | ECA | 70 | | | |
| | Xylene | 10 | | | |
| 5 | ECA | 70 | 0.09 | 0.15 | 0.25 |
| | Xylene | 10 | | | |
| | Cyclopentanone | 20 | | | |

*ECA: Ethylene glycol monoethyl ether acetate

What is claimed is:

1. A positive-working photoresist composition in the form of a homogeneous solution which consists of:
    (a) an alkyl pyruvate or a mixture of organic solvents mainly composed of alkyl pyruvate as the solvent,
    (b) an alkali-soluble novolac resin having a weight average molecular weight in the range of 2,000 to 20,000, and
    (c) a compound containing a quinone diazide group dissolved in the solvent, said compound being in the range of 10 to 40% by weight based on the amount of said alkali-soluble resin, and
wherein the amount of the solvent as component (a) is in the range of 50 to 2000 parts by weight per 100 parts by weight of the total amount of components (b) and (c).

2. The positive-working photoresist composition as claimed in claim 1 in which the alkyl pyruvate is methyl pyruvate or ethyl pyruvate.

3. The positive-working photoresist composition as claimed in claim 1 in which the mixture of organic solvents mainly composed of an alkyl pyruvate contains at least 70% by weight of the alkyl pyruvate.

4. The positive-working photoresist composition as claimed in claim 3 in which the organic solvent other than the alkyl pyruvate in the mixture of organic solvents mainly composed of an alkyl pyruvate is selected from the group consisting of aromatic hydrocarbon solvents, esters, polyhydric alcohols and esters and ethers thereof and ketones.

5. The positive-working photoresist composition as claimed in claim 1 in which the compound containing a quinone diazide group is an esterification product of a polyhydroxy benzophenone and naphthoquinone-1,2-diazide-5-sulfonic acid or naphthoquinone-1,2-diazide-4-sulfonic acid.

6. The positive-working photoresist composition as claimed in claim 5 in which the degree of esterification of the esterification product is at least 70%.

* * * * *